(12) United States Patent
Li et al.

(10) Patent No.: US 10,475,708 B2
(45) Date of Patent: Nov. 12, 2019

(54) SEMICONDUCTOR STRUCTURE AND METHOD FOR FORMING THE SAME

(71) Applicant: UNITED MICROELECTRONICS CORP., Hsinchu (TW)

(72) Inventors: Yong-Liang Li, Singapore (SG); Hao Su, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/299,395

(22) Filed: Mar. 12, 2019

(65) Prior Publication Data

US 2019/0214312 A1 Jul. 11, 2019

Related U.S. Application Data

(62) Division of application No. 15/679,346, filed on Aug. 17, 2017, now Pat. No. 10,276,451.

(51) Int. Cl.
| | |
|---|---|
| *H01L 21/8238* | (2006.01) |
| *H01L 27/092* | (2006.01) |
| *H01L 29/06* | (2006.01) |
| *H01L 29/423* | (2006.01) |
| *H01L 29/49* | (2006.01) |

(52) U.S. Cl.
CPC ........ *H01L 21/823842* (2013.01); *H01L 21/82385* (2013.01); *H01L 21/823835* (2013.01); *H01L 27/0928* (2013.01); *H01L 29/0653* (2013.01); *H01L 29/42376* (2013.01); *H01L 29/4916* (2013.01)

(58) Field of Classification Search
None
See application file for complete search history.

(56) References Cited

U.S. PATENT DOCUMENTS

| 7,858,462 | B2 | 12/2010 | Hase |
| 2006/0263961 | A1* | 11/2006 | Kittl ............... H01L 21/82384 438/199 |
| 2008/0169511 | A1 | 7/2008 | Muller et al. |
| 2008/0227280 | A1 | 9/2008 | Hase |
| 2009/0085126 | A1 | 4/2009 | Yu et al. |
| 2009/0117726 | A1 | 5/2009 | Pas |
| 2010/0244147 | A1 | 9/2010 | Yang et al. |

FOREIGN PATENT DOCUMENTS

EP    1724828 A2    11/2006

* cited by examiner

*Primary Examiner* — Thien F Tran
(74) *Attorney, Agent, or Firm* — WPAT, PC (57) ABSTRACT

A semiconductor structure includes a substrate and a CMOS structure. The CMOS structure includes a PMOS structure and a NMOS structure. The PMOS structure includes two first source/drain regions disposed in the substrate, a first gate dielectric disposed partially in the substrate between the first source/drain regions, and a fully silicided gate electrode disposed on the first gate dielectric. The NMOS structure includes two second source/drain regions disposed in the substrate, a second gate dielectric disposed partially in the substrate between the second source/drain regions, and a non-silicided conductive gate electrode disposed on the second gate dielectric.

10 Claims, 10 Drawing Sheets

SEMICONDUCTOR STRUCTURE AND METHOD FOR FORMING THE SAME

This application is a divisional application of co-pending U.S. application Ser. No. 15/679,346, filed Aug. 17, 2017, the subject matter of which is incorporated herein by reference.

TECHNICAL FIELD

This disclosure relates to a semiconductor structure and a method for forming the same. More particularly, this disclosure relates to a semiconductor structure comprising a CMOS structure and a method for forming the same.

BACKGROUND

A complementary MOS (CMOS) device comprises two types of MOS devices that are complementary to each other, i.e., p-type MOS (PMOS) device and n-type MOS (NMOS) device. Since one of the MOS device pair is always off, a CMOS device consumes power only during switching between on and off states. Thereby, the CMOS devices have been widely used in semiconductor devices. Typically, in a semiconductor device, CMOS devices are used in both the high voltage areas and the low voltage areas. For the operation under the different levels of voltages, the CMOS devices and the related elements may have different modified structures. The CMOS devices used in the high voltage areas are also known as high-voltage CMOS (HV CMOS) devices. The CMOS devices used in the low voltage areas are also known as low-voltage CMOS (LV CMOS) devices.

SUMMARY

This disclosure is directed to a semiconductor structure in which a CMOS structure, particularly a HV CMOS structure, is provided. This disclosure is also directed to a method for forming the same.

According to some embodiments, a semiconductor structure comprises a substrate and a CMOS structure. The CMOS structure comprises a PMOS structure and a NMOS structure. The PMOS structure comprises two first source/drain regions disposed in the substrate, a first gate dielectric disposed partially in the substrate between the first source/drain regions, and a fully silicided gate electrode disposed on the first gate dielectric. The NMOS structure comprises two second source/drain regions disposed in the substrate, a second gate dielectric disposed partially in the substrate between the second source/drain regions, and a non-silicided conductive gate electrode disposed on the second gate dielectric.

According to some embodiments, a method for forming a semiconductor structure comprises the following steps. At first, a preliminary structure is provided. The preliminary structure has a PMOS region and a NMOS region. The preliminary structure comprises a substrate, two first source/drain regions formed in the substrate in the PMOS region, and two second source/drain regions formed in the substrate in the NMOS region. Then, a first gate dielectric and a second gate dielectric are formed. The first gate dielectric is formed partially into the substrate between the first source/drain regions. The second gate dielectric is formed partially into the substrate between the second source/drain regions. A fully silicided gate electrode is formed on the first gate dielectric. A non-silicided conductive gate electrode is formed on the second gate dielectric.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. For clarity, the elements in the figures may not be drawn to scale. In addition, some elements and/or reference numerals may be omitted from the figures. It is contemplated that elements and features of one embodiment may be beneficially incorporated in another embodiment without further recitation.

Figure 1:
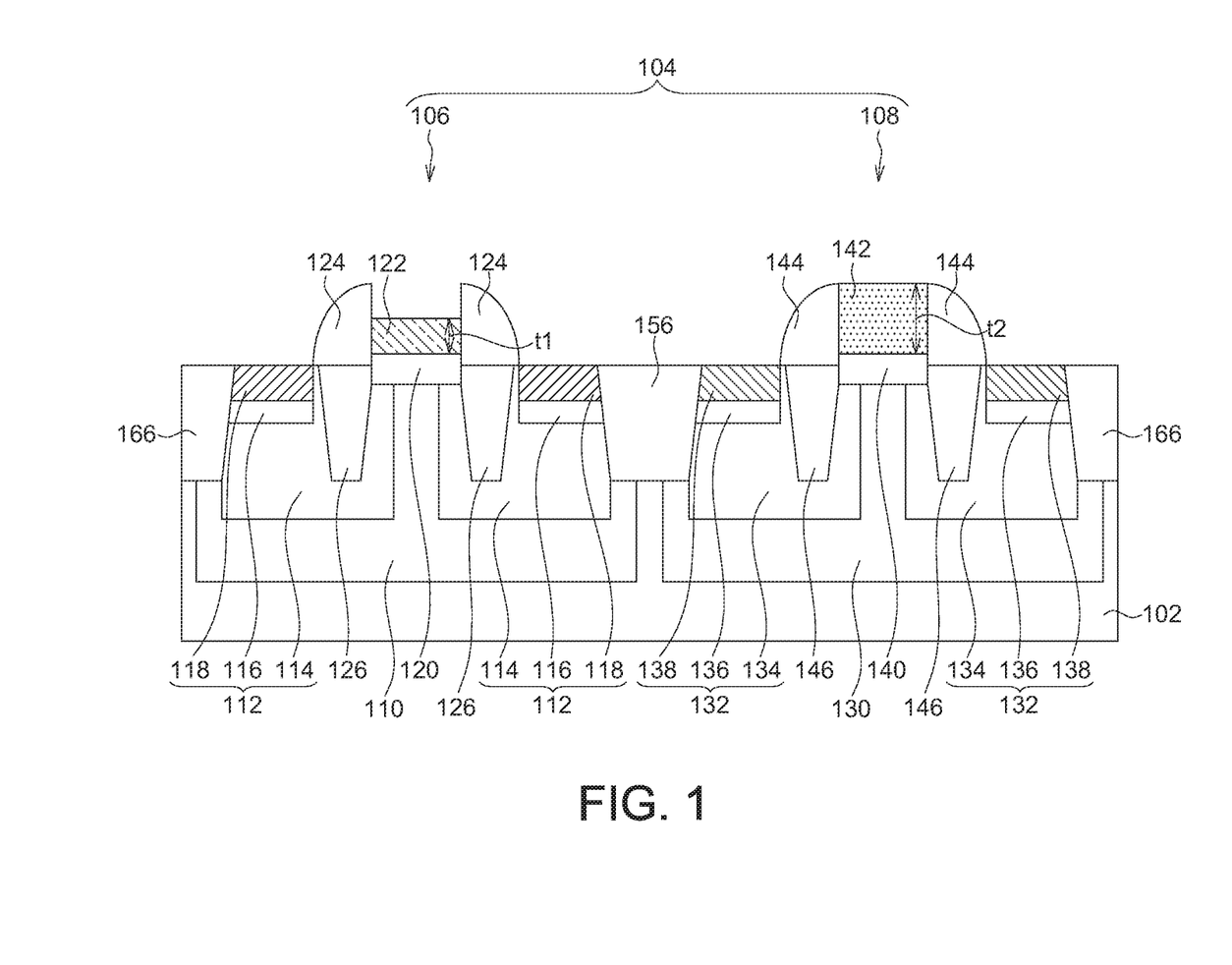
FIG. 1 illustrates a semiconductor structure according to embodiments.

Referring to FIG. 1, a semiconductor structure is shown according to embodiments. The semiconductor structure comprises a substrate 102, such as a p-type substrate, and a CMOS structure 104. The CMOS structure 104 comprises a PMOS structure 106 and a NMOS structure 108.

The PMOS structure 106 comprises two first source/drain regions 112 disposed in the substrate 102, a first gate dielectric 120 disposed partially in the substrate 102 between the first source/drain regions 112, and a fully silicided gate electrode 122 disposed on the first gate dielectric 120. More specifically, the PMOS structure 106 may further comprise a n-type well 110 disposed in the substrate 102. The first source/drain regions 112 are disposed in the n-type well 110 and separated from each other. Each of the first source/drain regions 112 may comprise a p-type doped region 114 disposed in the n-type well 110, a heavily p-type doped region 116 disposed in the p-type doped region 114, and a p-type silicide region 118 disposed on the heavily p-type doped region 116.

The first gate dielectric 120 is disposed between the first source/drain regions 112. The first gate dielectric 120 is disposed partially in the substrate 102. In other words, the first gate dielectric 120 is disposed with part of it in the substrate 102 and part of it on the substrate 102. For example, the first gate dielectric 120 may have a thickness of 800 Å to 1100 Å, wherein about half of it, such as a portion with a thickness of 368 Å to 506 Å, may be formed into the substrate 102. Such thick gate dielectric is particularly suitable for the application in high voltage areas since it provides a better resistance against the high voltages applied to the device, such as a voltage equal to or larger than 16 V even up to 32 V. While in a LV MOS device, the gate dielectric is typically thinner and disposed on the substrate without part of it formed into the substrate. The first gate dielectric 120 may be formed of oxide. The fully silicided gate electrode 122 is disposed on the first gate dielectric 120. The fully silicided gate electrode 122 may be formed of nickel silicide, titanium silicide, cobalt silicide, or the like. The PMOS structure 106 may further comprise spacers 124 disposed at two sides of the fully silicided gate electrode 122 and the first gate dielectric 120.

In some embodiments, as shown in FIG. 1, the PMOS structure 106 may further comprise first isolation structures 126 disposed in the p-type doped regions 114, respectively. The first isolation structures 126 are disposed at two sides of the first gate dielectric 120. More specifically, each of the first isolation structure 126 may be disposed between the first gate dielectric 120 and the corresponding heavily p-type doped region 116. The first isolation structures 126 may be shallow trench isolation structures.

The NMOS structure 108 comprises two second source/drain regions 132 disposed in the substrate 102, a second gate dielectric 140 disposed partially in the substrate 102 between the second source/drain regions 132, and a non-silicided conductive gate electrode 142 disposed on the second gate dielectric 140. More specifically, the NMOS structure 108 may further comprise a p-type well 130 disposed in the substrate 102. The second source/drain regions 132 are disposed in the p-type well 130 and separated from each other. Each of the second source/drain regions 132 may comprise a n-type doped region 134 disposed in the p-type well 130, a heavily n-type doped region 136 disposed in the n-type doped region 134, and a n-type silicide region 138 disposed on the heavily n-type doped region 136.

The second gate dielectric 140 is disposed between the first source/drain regions 112. The second gate dielectric 140 is disposed partially in the substrate 102 in a similar manner to the first gate dielectric 120. The second gate dielectric 140 may be formed of oxide, such as the same oxide for forming the first gate dielectric 120. The non-silicided conductive gate electrode 142 is disposed on the second gate dielectric 140. The non-silicided conductive gate electrode 142 may be formed of n-type doped polysilicon. The NMOS structure 108 may further comprise spacers 144 disposed at two sides of the non-silicided conductive gate electrode 142 and the second gate dielectric 140.

In some embodiments, as shown in FIG. 1, the NMOS structure 108 may further comprise second isolation structures 146 disposed in the n-type doped regions 134, respectively. The second isolation structures 146 are disposed at two sides of the second gate dielectric 140. More specifically, each of the second isolation structures 146 may be disposed between the second gate dielectric 140 and the corresponding heavily n-type doped region 136. The second isolation structures 146 may be shallow trench isolation structures.

The fully silicided gate electrode 122 of the PMOS structure 106 has a first thickness t1. The non-silicided conductive gate electrode 142 of the NMOS structure 108 has a second thickness t2. According to some embodiments, the first thickness t1 may be smaller than the second thickness t2, as shown in FIG. 1. In some embodiments, the first thickness t1 is smaller than half of the second thickness t2. For example, the second thickness t2 may be about 100 nm, and the first thickness t1 may be only about 15 nm to 45 nm.

The semiconductor structure may further comprise a third isolation structure 156 for the isolation between the PMOS structure 106 and the NMOS structure 108. The semiconductor structure may further comprise fourth isolation structures 166 for the isolation between the CMOS structure 104 and the adjacent device. Similar to the first isolation structures 126 and the second isolation structures 146, the third isolation structure 156 and the fourth isolation structures 166 may be shallow trench isolation structures.

A method for forming such semiconductor structure comprises the following steps. At first, a preliminary structure is provided. The preliminary structure has a PMOS region and a NMOS region. The preliminary structure comprises a substrate, two first source/drain regions formed in the substrate in the PMOS region, and two second source/drain regions formed in the substrate in the NMOS region. Then, a first gate dielectric and a second gate dielectric are formed. The first gate dielectric is formed partially into the substrate between the first source/drain regions. The second gate dielectric is formed partially into the substrate between the second source/drain regions. A fully silicided gate electrode is formed on the first gate dielectric. A non-silicided conductive gate electrode is formed on the second gate dielectric. Referring to FIGS. 2A-2I, such method is shown according to embodiments. It is noted that the processes in the formation may be appropriately modified, changed, combined, and/or divided. For example, the order of some processes may be exchanged.

Figure 2A:
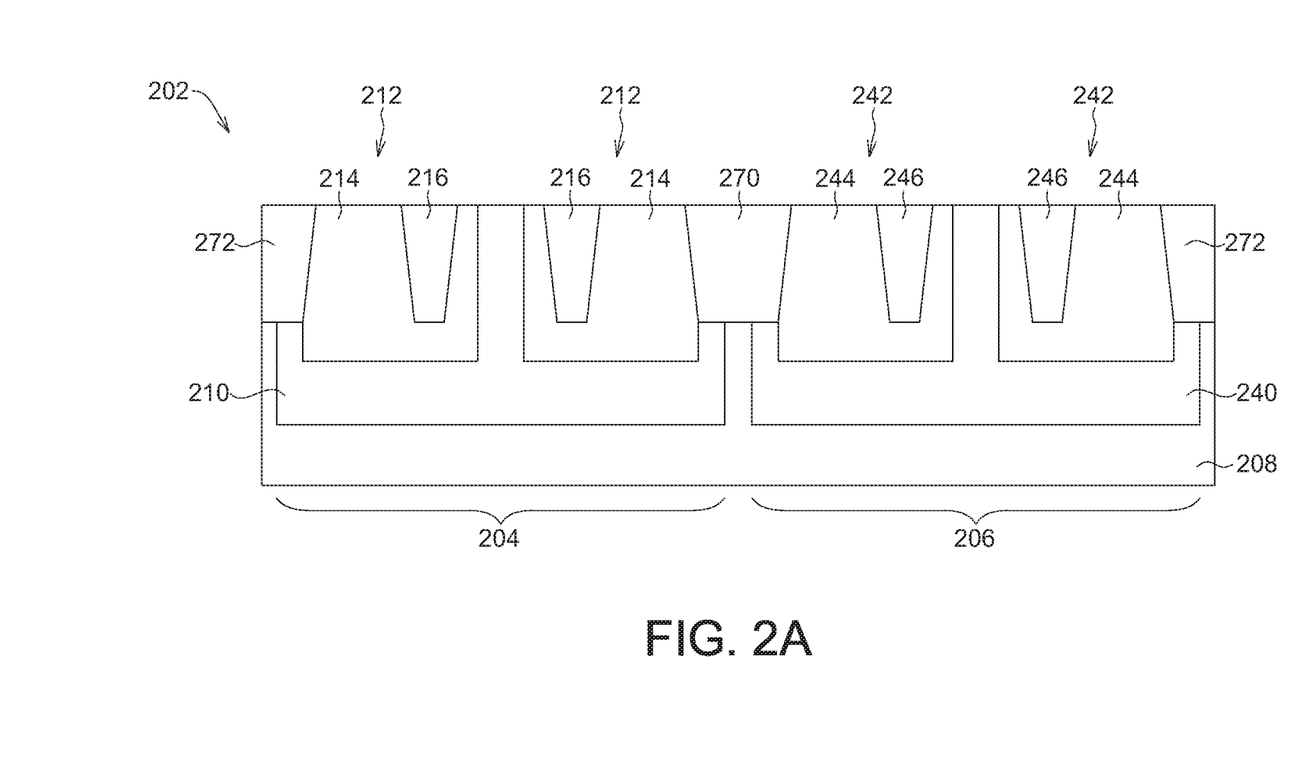
FIGS. 2A-2I illustrate a semiconductor structure at various stages of formation according to embodiments.

As shown in FIG. 2A, a preliminary structure 202 having a PMOS region 204 and a NMOS region 206 is provided. The preliminary structure 202 comprises a substrate 208, two first source/drain regions 212, and two second source/drain regions 242. The first source/drain regions 212 are formed in the substrate 208 in the PMOS region 204. The second source/drain regions 242 are formed in the substrate 208 in the NMOS region 206. More specifically, the preliminary structure 202 may further comprise a n-type well 210 and a p-type well 240. The n-type well 210 is in the substrate 208 in the PMOS region 204. Each of the first source/drain regions 212 may comprise a p-type doped region 214 disposed in the n-type well 210. The preliminary structure 202 may further comprise first isolation structures 216 in the p-type doped regions 214, respectively. The p-type well 240 is in the substrate 208 in the NMOS region 206. Each of the second source/drain regions 242 may comprise a n-type doped region 244 disposed in the p-type well 240. The preliminary structure 202 may further comprise second isolation structures 246 in the n-type doped regions 244, respectively. The preliminary structure 202 may further comprise a third isolation structure 270 for the isolation between the PMOS region 204 and the NMOS region 206. The semiconductor structure may further comprise fourth isolation structures 272 for the isolation between the PMOS region 204/NMOS region 206 and other adjacent regions.

Figure 2B:
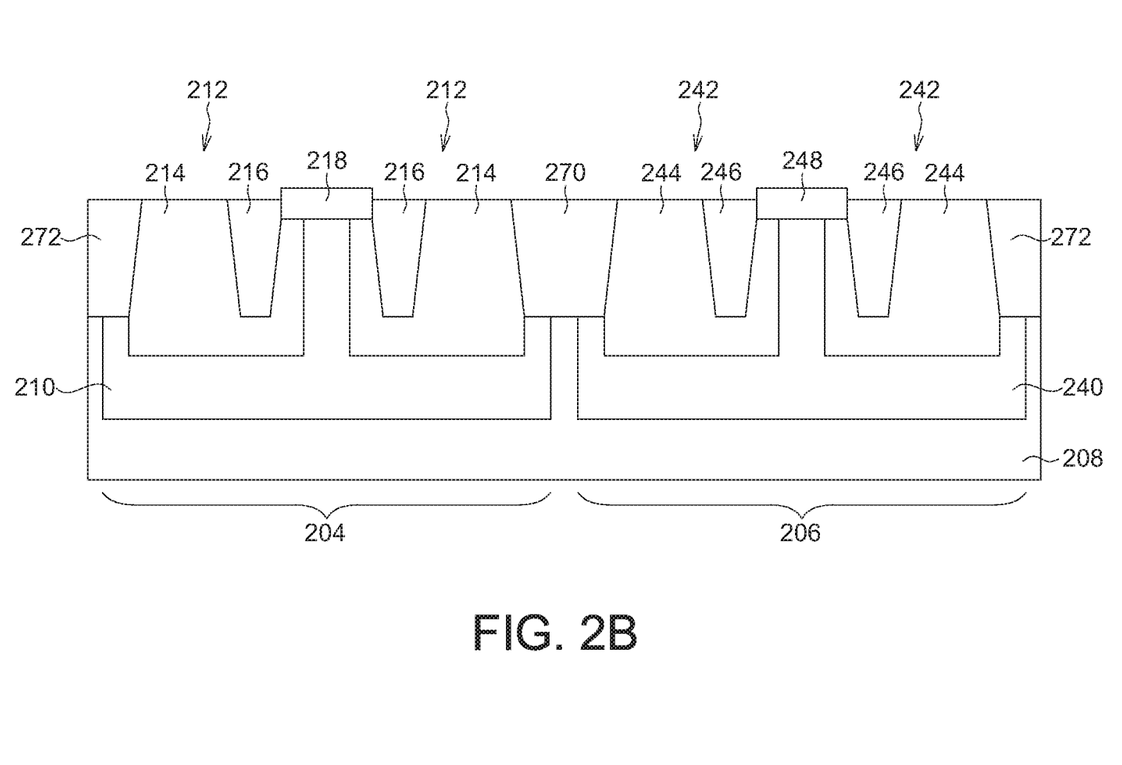

Then, as shown in FIG. 2B, a first gate dielectric 218 and a second gate dielectric 248 are formed, such as by a deposition process. The first gate dielectric 218 is formed partially into the substrate 208 between the first source/drain regions 212. The second gate dielectric 248 is formed partially into the substrate 208 between the second source/drain regions 242. The first gate dielectric 218 and the second gate dielectric 248 may be formed of oxide. The first gate dielectric 218 and the second gate dielectric 248 may have a thickness of 800 Å to 1100 Å, wherein about half of it, such as 368 Å to 506 Å, is in the substrate 208.

Figure 2C:
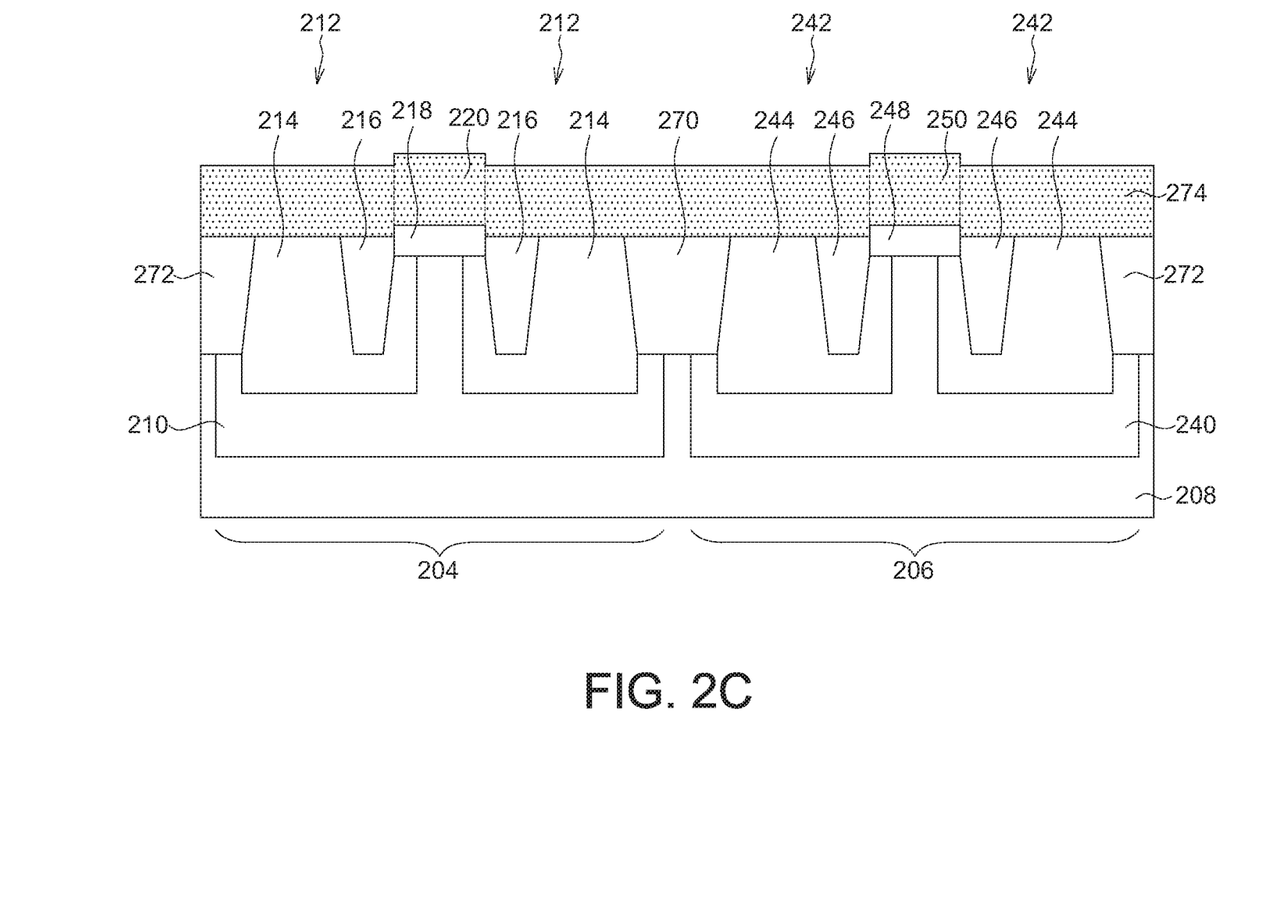

The formation of the fully silicided gate electrode and the non-silicided conductive gate electrode may begin by forming a polysilicon layer 274, as shown in FIG. 2C. The polysilicon layer 274 comprises a first polysilicon portion 220 on the first gate dielectric 218 and a second polysilicon portion 250 on the second gate dielectric 248.

Figure 2D:
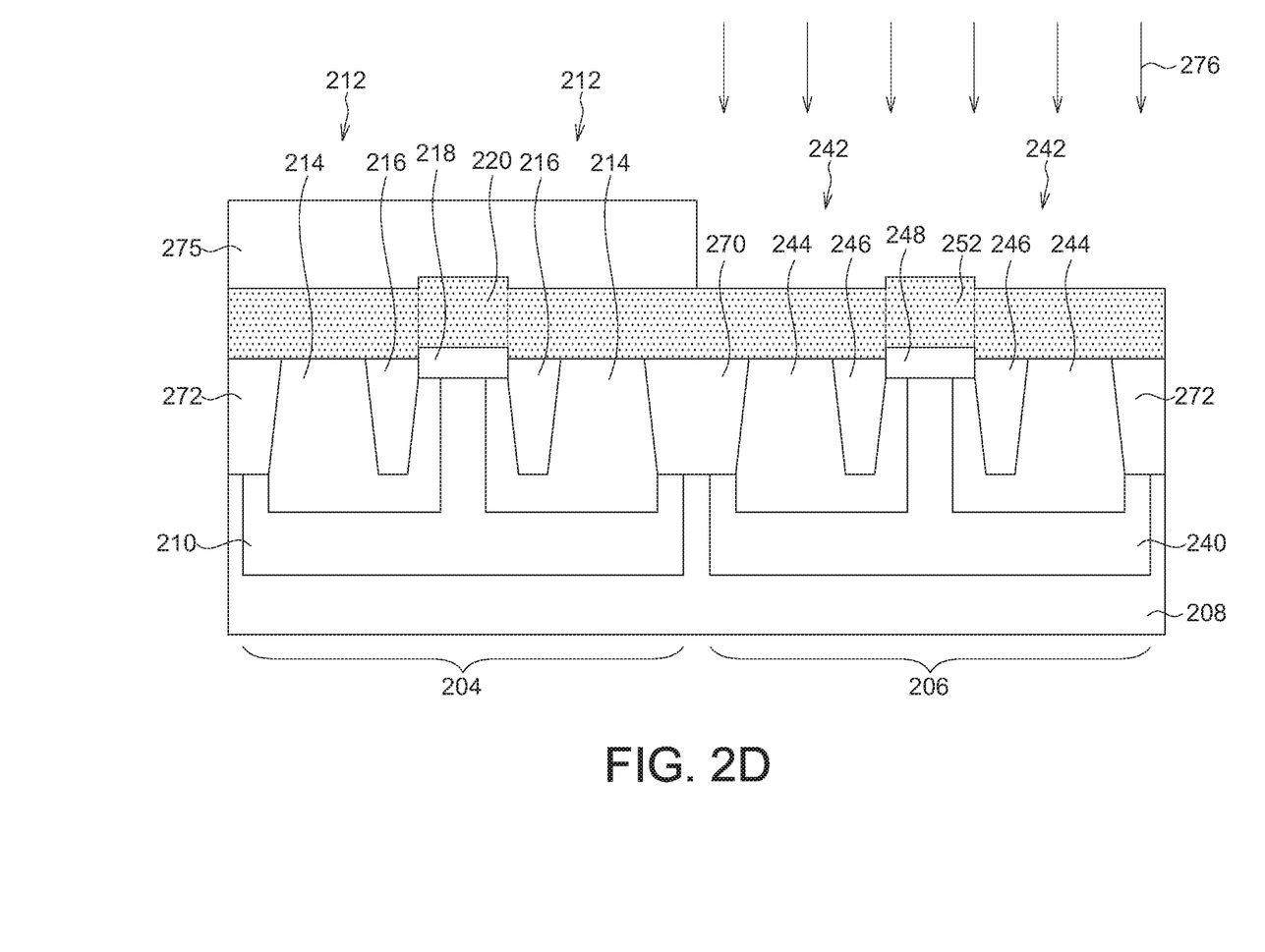

As shown in FIG. 2D, a n-type dopant is implanted into the second polysilicon portion 250 by a first implantation process, as indicated by the arrow 276, to form a non-silicided conductive gate electrode 252. In some embodiments, as shown in FIG. 2D, a photoresist 275 is provided to cover the PMOS region 204, and the first implantation process is applied only to the NMOS region 206. In some other embodiments, for providing the desired PMOS characteristics, the n-type dopant may also be implanted into the first polysilicon portion 220.

Figure 2E:
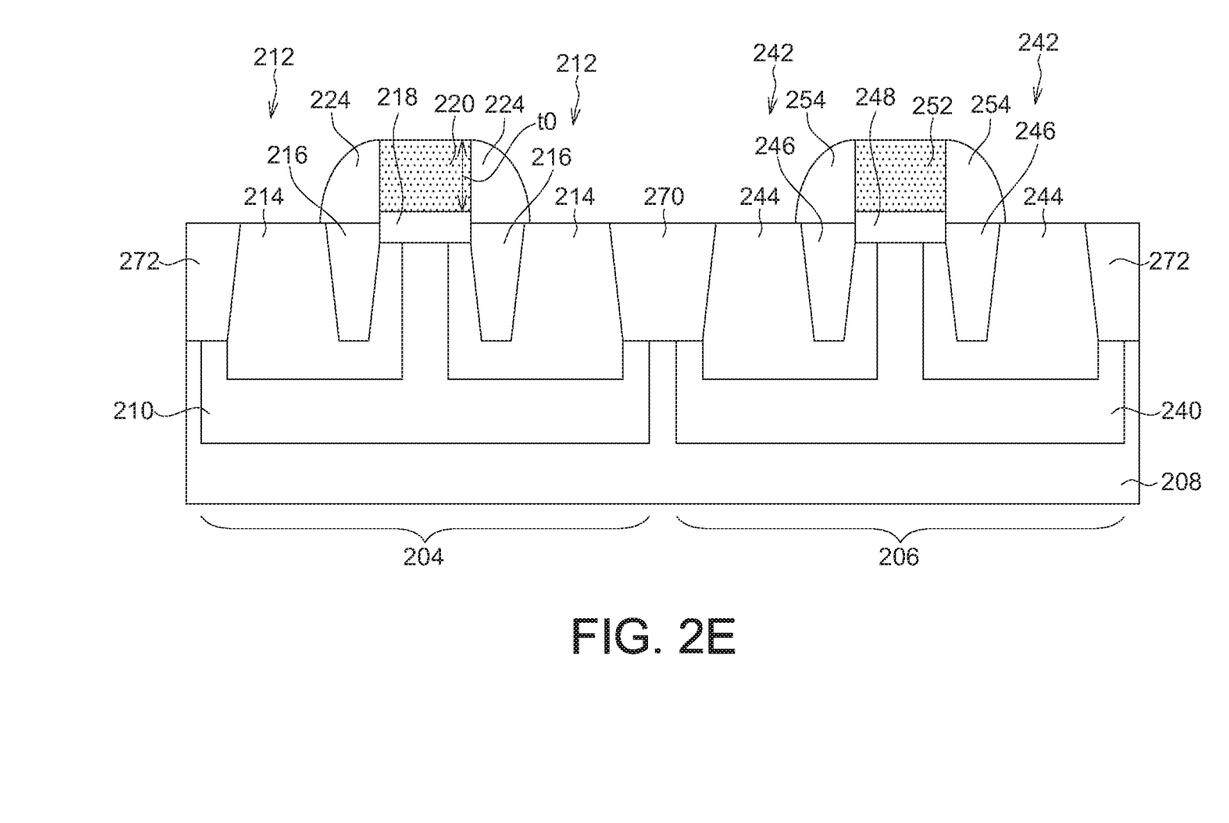

As shown in FIG. 2E, the redundant portions of the polysilicon layer 274 then be removed, such as by an etching step. The first polysilicon portion 220 remains on the first gate dielectric 218 may have a thickness t0. While not shown in the drawing, the non-silicided conductive gate electrode 252 may have the same thickness t0. Spacers 224 may be formed at two sides of the first polysilicon portion 220 and the first gate dielectric 218, and spacers 254 may be formed at two sides of the non-silicided conductive gate electrode 252 and the second gate dielectric 248. The formation of the spacers 224 and the spacers 254 may comprise a deposition step and an etching step.

Figure 2F:
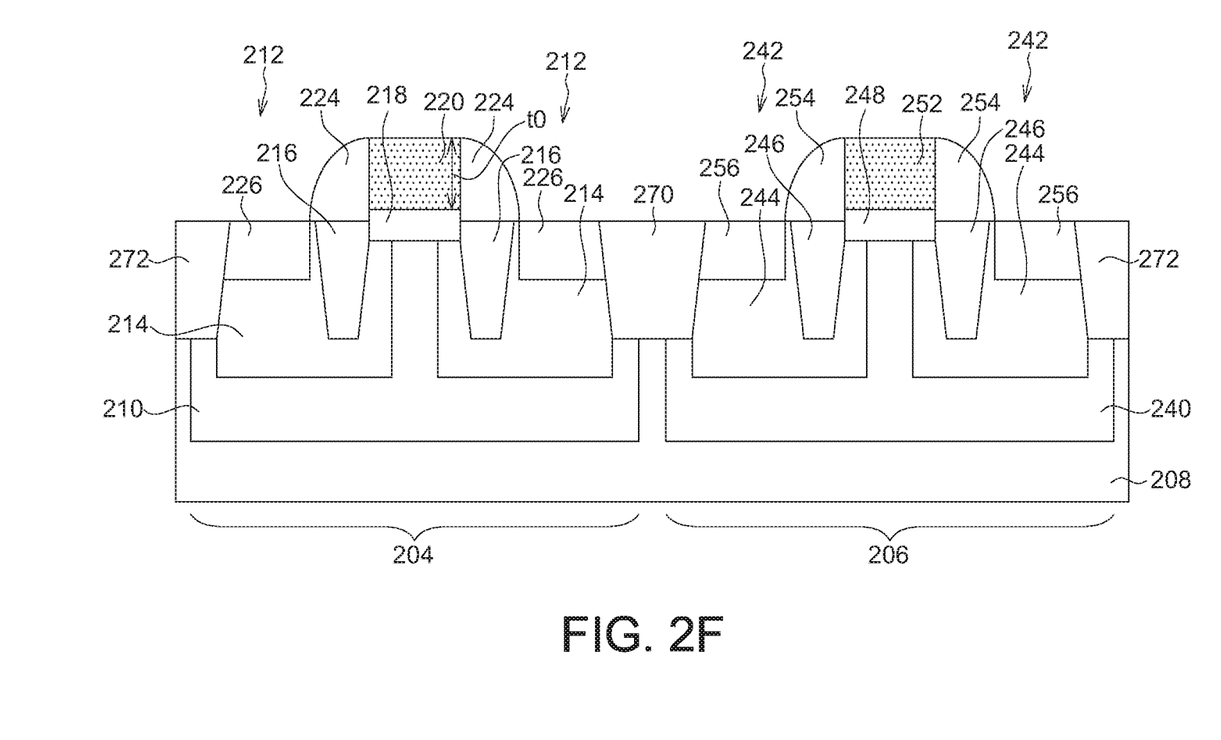

As shown in FIG. 2F, a p-type dopant may be implanted into the p-type doped regions 214 by a second implantation process to form heavily p-type doped regions 226 in the p-type doped regions 214, respectively. A n-type dopant may be implanted into the n-type doped regions 244 by a third implantation process to form heavily n-type doped regions 256 in the n-type doped regions 244, respectively. In some embodiments, for providing the desired PMOS characteristics, the p-type dopant may also be implanted into the first polysilicon portion 220 in the second implantation process.

Figure 2G:
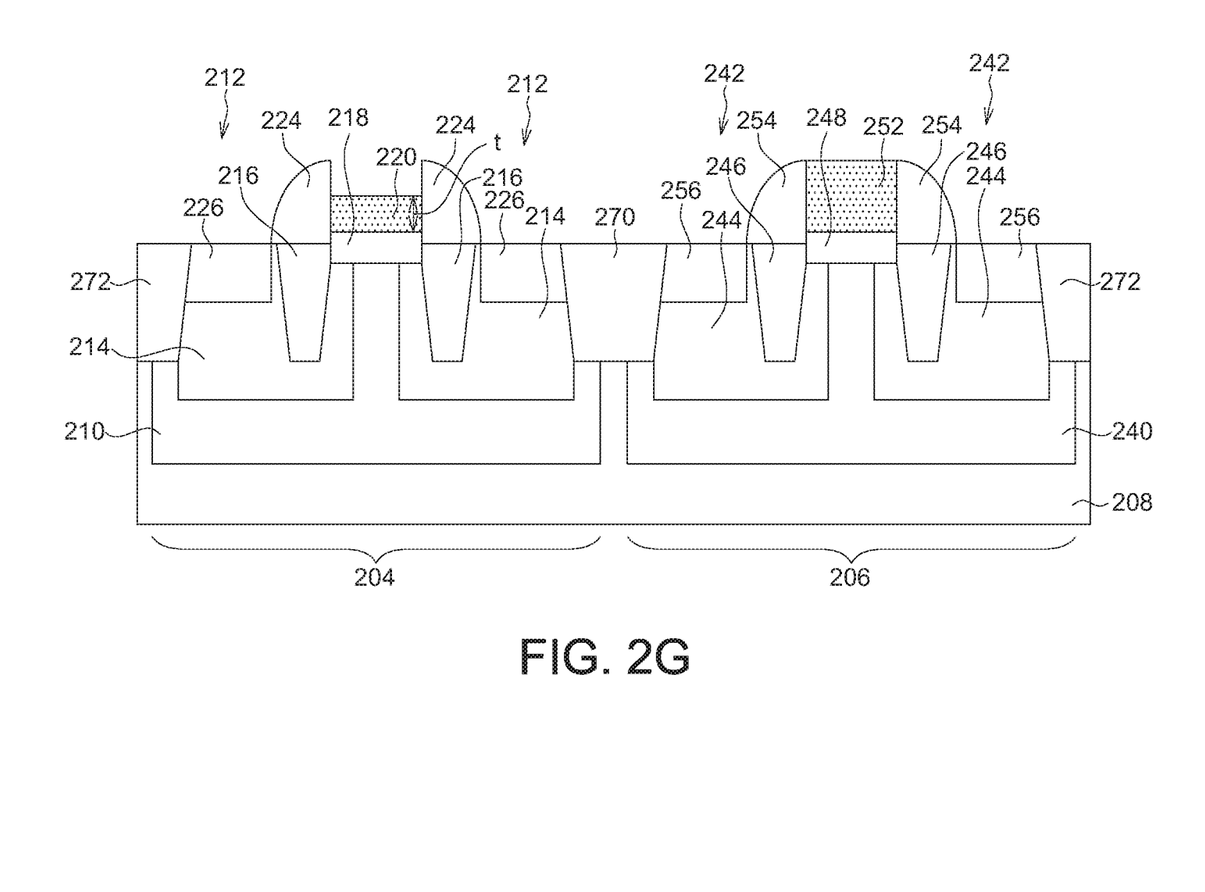

Optionally, a thinning process may then be conducted, as shown in FIG. 2G. The first polysilicon portion 220 is thinned by the thinning process to ensure that the first polysilicon portion 220 can be fully silicided in a following silicide process. A thickness t of the first polysilicon portion 220 after the thinning process may be less than half of the thickness t0 of the first polysilicon portion 220 before the thinning process. For example, the thickness t0 may be about 100 nm, and the thickness t may be about 15 nm to 45 nm.

Figure 2H:
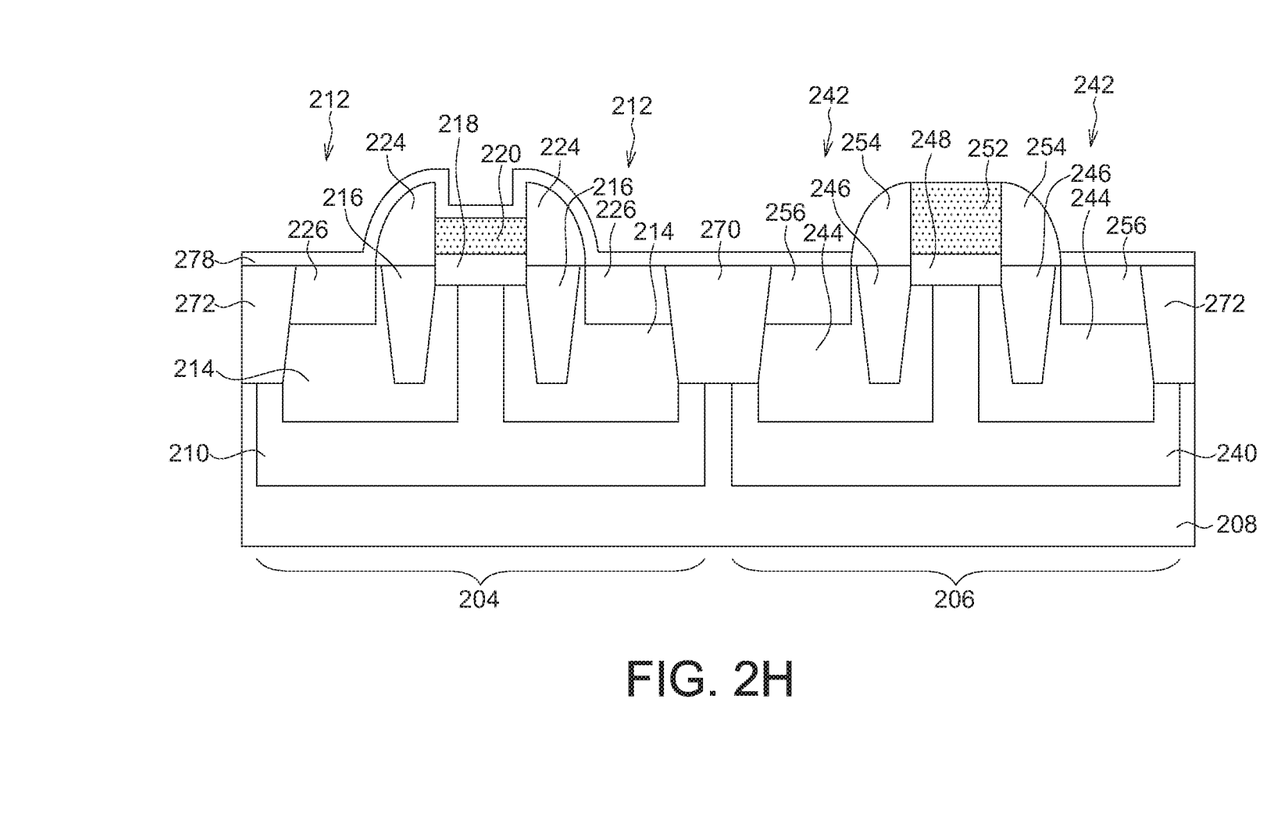

Then, the first polysilicon portion 220 is transferred into a fully silicided material by the silicide process to form a fully silicided gate electrode 230. As shown in FIG. 2H, a metal layer 278 may be formed on the elements for which the silicide process is desired, i.e., the first polysilicon portion 220, the heavily p-type doped regions 226, and the heavily n-type doped regions 256. The non-silicided conductive gate electrode 252 will not be silicided. For example, it can be protected by a photoresist (not shown) and thereby the metal layer 278 is not formed thereon. The metal of the metal layer 278 may be nickel, titanium, cobalt, or the like. The metal reacted with the silicon of the elements described above, and thereby the silicides can be formed.

Figure 2I:
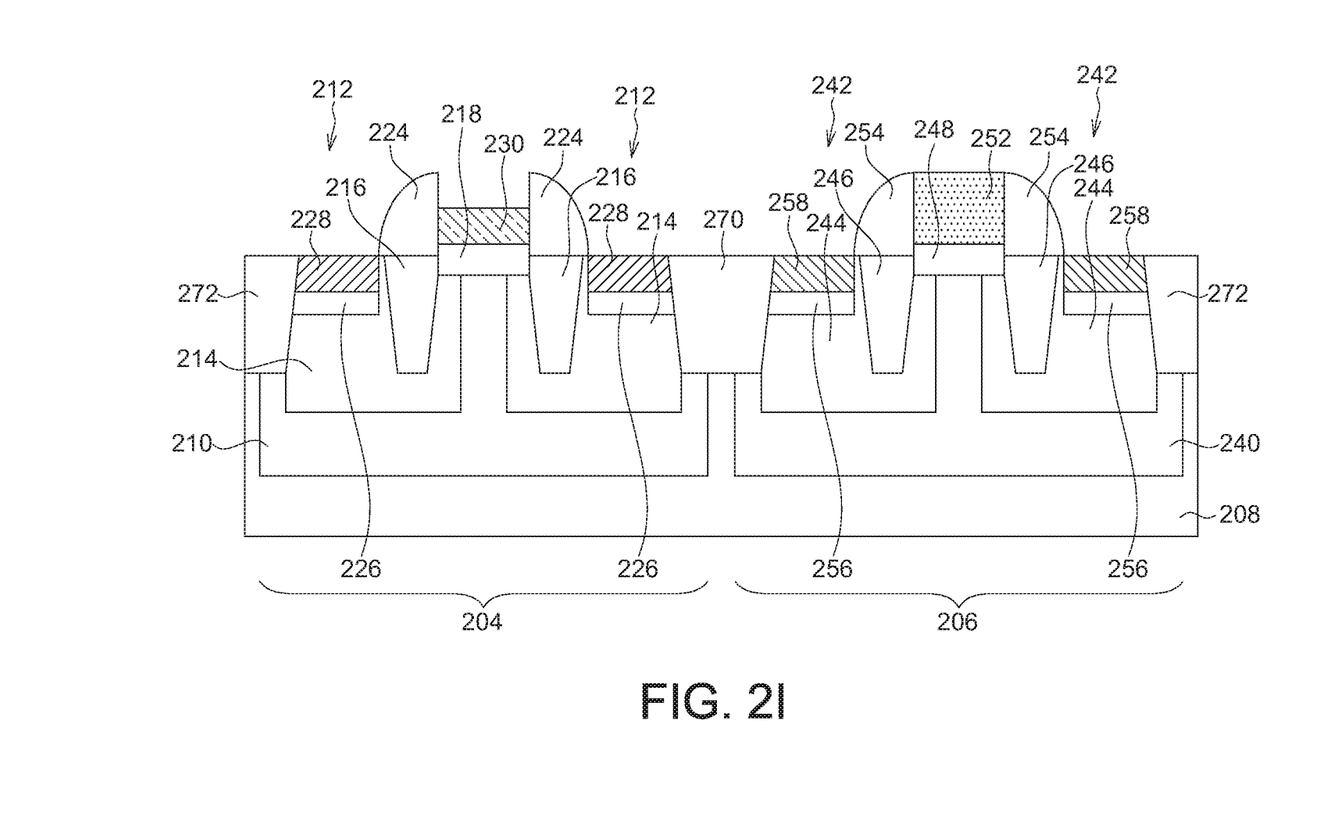

As shown in FIG. 2I, by the silicide process, the first polysilicon portion 220 is completely transferred into the fully silicided gate electrode 230, p-type silicide regions 228 are formed on the heavily p-type doped regions 226, respectively, and n-type silicide regions 258 are formed on the heavily n-type doped regions 256, respectively. Corresponding to various metals that can be used to form the metal layer 278, the fully silicided gate electrode 230 may be formed of nickel silicide, titanium silicide, cobalt silicide, or the like.

The processes described above are compatible with the typical manufacturing process for CMOS devices, and thereby can be easily integrated into the present manufacturing flow. In addition, the characteristics of the CMOS device, such as the work functions, the threshold voltage and the on-current, can be easily adjusted by modifying the process details. Such details comprise but not limited to the thickness, the implantation type (intrinsic, p-type, or n-type) and concentration of the gate electrode, particularly those of the fully silicided gate electrode. For example, any one or combination of the thinning process as shown in FIG. 2G, the n-type implantation process as shown in FIG. 2D, and the p-type implantation process as shown in FIG. 2F may be applied for modifying the work function of the fully silicided gate electrode.

In the semiconductor structure according to the embodiments, different work functions for the PMOS structure and the NMOS structure are provided by a fully silicided gate electrode and a non-silicided conductive gate electrode. While in some existing CMOS devices, non-silicided conductive gate electrodes formed of n-type doped polysilicon are used in both the PMOS device and the NMOS device, and the function of the PMOS device is provided by an additional p-type doped channel region under the gate dielectric, which is formed by an ion implantation process during which the dopant pass through the gate dielectric. Compared to such case, the semiconductor structure according to the embodiments can be formed by a simpler manufacturing process and the cost can be reduced since the additional doped channel region is not formed. In addition, the negative impact on reliability due to the ion implantation process through the gate dielectric can be avoided.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for forming a semiconductor structure, comprising:
   providing a preliminary structure having a PMOS region and a NMOS region, the preliminary structure comprising:
      a substrate;
      two first source/drain regions formed in the substrate in the PMOS region; and
      two second source/drain regions formed in the substrate in the NMOS region;
   forming a first gate dielectric partially into the substrate between the first source/drain regions and a second gate dielectric partially into the substrate between the second source/drain regions;
   forming a fully silicided gate electrode on the first gate dielectric, wherein forming the fully silicided gate electrode comprises forming a metal layer on the first gate dielectric but not on the second gate dielectric; and
   forming a non-silicided conductive gate electrode on the second gate dielectric.

2. The method according to claim 1, wherein forming the fully silicided gate electrode and forming the non-silicided conductive gate electrode comprise:
   forming a first polysilicon portion on the first gate dielectric and a second polysilicon portion on the second gate dielectric;
   implanting a n-type dopant into the second polysilicon portion by a first implantation process to form the non-silicided conductive gate electrode; and
   transferring the first polysilicon portion into a fully silicided material by a silicide process to form the fully silicided gate electrode.

3. The method according to claim 2, wherein forming the fully silicided gate electrode further comprises:

before the silicide process, thinning the first polysilicon portion by a thinning process.

4. The method according to claim 3, wherein a thickness of the first polysilicon portion after the thinning process is less than half of a thickness of the first polysilicon portion before the thinning process.

5. The method according to claim 3, wherein forming the fully silicided gate electrode further comprises:

in the first implantation process, implanting the n-type dopant into the first polysilicon portion.

6. The method according to claim 3, wherein the preliminary structure further comprises:

a n-type well in the substrate in the PMOS region, wherein each of the first source/drain regions comprises a p-type doped region disposed in the n-type well; and a p-type well in the substrate in the NMOS region, wherein each of the second source/drain regions comprises a n-type doped region disposed in the p-type well; and the method further comprises:

implanting a p-type dopant into the p-type doped regions by a second implantation process to form heavily p-type doped regions in the p-type doped regions, respectively; and implanting a n-type dopant into the n-type doped regions by a third implantation process to form heavily n-type doped regions in the n-type doped regions, respectively.

7. The method according to claim 6, wherein forming the fully silicided gate electrode further comprises:

in the second implantation process, implanting the p-type dopant into the first polysilicon portion.

8. The method according to claim 6, wherein the thinning process is conducted after the second implantation process and the third implantation process.

9. The method according to claim 6, further comprising:

forming p-type silicide regions on the heavily p-type doped regions, respectively, and n-type silicide regions on the heavily n-type doped regions, respectively, by the silicide process.

10. The method according to claim 1, wherein the fully silicided gate electrode is formed of nickel silicide, titanium silicide, or cobalt silicide.

* * * * *